US 6,628,132 B2

(12) United States Patent
Pfahnl et al.

(10) Patent No.: US 6,628,132 B2
(45) Date of Patent: Sep. 30, 2003

(54) METHODS AND APPARATUS FOR TESTING A SEMICONDUCTOR STRUCTURE USING IMPROVED TEMPERATURE DESOAK TECHNIQUES

(75) Inventors: Andreas C. Pfahnl, Goffstown, NH (US); John J. Dunn, Jr., Peabody, MA (US)

(73) Assignee: Teradyne, Inc., Boston, MA (US)

(*) Notice: Subject to any disclaimer, the term of this patent is extended or adjusted under 35 U.S.C. 154(b) by 41 days.

(21) Appl. No.: 09/928,001

(22) Filed: Aug. 10, 2001

(65) Prior Publication Data

US 2003/0030430 A1 Feb. 13, 2003

(51) Int. Cl.[7] .............................................. G01R 31/02
(52) U.S. Cl. ................................... 324/760; 324/158.1
(58) Field of Search .............................. 324/760, 158.1, 324/765, 754; 165/80.1, 80.2, 80.3

(56) References Cited

U.S. PATENT DOCUMENTS

| 3,710,251 A | * | 1/1973 | Hagge et al. ............... 324/760 |
| 3,979,671 A | | 9/1976 | Meeker et al. .............. 324/158 |
| 4,115,736 A | * | 9/1978 | Tracy ........................ 324/760 |
| 4,162,141 A | | 7/1979 | West ......................... 432/144 |
| 4,261,519 A | | 4/1981 | Ester ......................... 239/548 |
| 4,370,011 A | | 1/1983 | Suzuki et al. ................. 339/74 |
| 4,604,572 A | | 8/1986 | Horiuchi et al. ............ 324/158 |
| 4,607,220 A | | 8/1986 | Hollman .................... 324/158 |
| 4,695,707 A | | 9/1987 | Young ....................... 219/392 |
| 4,734,872 A | | 3/1988 | Eager et al. ................ 364/557 |
| 4,739,257 A | | 4/1988 | Jenson et al. .............. 324/158 |
| 4,787,752 A | | 11/1988 | Fraser et al. ................. 374/45 |
| 4,791,364 A | | 12/1988 | Kufis et al. ................. 324/158 |
| 4,839,587 A | * | 6/1989 | Flatley et al. .............. 324/761 |
| 4,848,090 A | | 7/1989 | Peters .......................... 62/3.3 |

(List continued on next page.)

FOREIGN PATENT DOCUMENTS

| DE | 41 04 098 A1 | 8/1991 |
| WO | WO 93/20678 | 10/1993 |
| WO | WO 97/15837 | 5/1997 |

OTHER PUBLICATIONS

Jerry I. Tustaniwskyj and James W. Babcock; Constant Temperature Control of a Device Under Test (DUT) – Part 1; EEP–vol. 19–2, Advances in Electronic Packaging 1997; The American Society of Mechanical Engineers; pp. 2031–2036.

(List continued on next page.)

Primary Examiner—Ernest Karlsen
(74) Attorney, Agent, or Firm—Chapin & Huang, L.L.C.; David E. Huang, Esq.

(57) ABSTRACT

A semiconductor handling system has a temperature soak assembly to temperature soak a semiconductor structure (e.g., a panel), a test assembly to test the semiconductor structure, and a temperature desoak assembly to temperature desoak the semiconductor structure. The temperature desoak assembly includes (i) a heat sink that defines a surface which is configured to thermally couple with the semiconductor structure, (ii) a fluid guide coupled to the heat sink, and (iii) a fluid controller coupled to the fluid guide. The fluid controller provides a fluid (e.g., room temperature air) which the fluid guide directs over the heat sink to bring a temperature of the heat sink to a temperature of the fluid. This arrangement provides an effective low cost and low power means for temperature desoaking a semiconductor structure.

14 Claims, 9 Drawing Sheets

U.S. PATENT DOCUMENTS

| | | | |
|---|---|---|---|
| 4,926,118 A | 5/1990 | O'Connor et al. | 324/158 |
| 4,962,355 A | 10/1990 | Holderfield et al. | 324/158 |
| 4,982,153 A | 1/1991 | Collins et al. | 324/158 |
| 5,034,688 A * | 7/1991 | Moulene et al. | 324/760 |
| 5,086,269 A | 2/1992 | Nobi | 324/158 |
| 5,126,656 A | 6/1992 | Jones | 324/158 |
| 5,131,535 A | 7/1992 | O'Connor et al. | 206/329 |
| 5,155,579 A | 10/1992 | AuYeung | 357/81 |
| 5,164,661 A | 11/1992 | Jones | 324/158 |
| 5,166,607 A | 11/1992 | Long | 324/158 |
| 5,172,049 A | 12/1992 | Kiyokawa et al. | 324/158 |
| 5,180,974 A | 1/1993 | Mitchell et al. | 324/158 |
| 5,184,068 A | 2/1993 | Twigg et al. | 324/158 |
| 5,203,452 A | 4/1993 | Small et al. | 206/329 |
| 5,283,854 A | 2/1994 | Schiebelhuth | 392/467 |
| 5,290,134 A | 3/1994 | Baba | 414/404 |
| 5,307,011 A | 4/1994 | Tani | 324/158 |
| 5,309,978 A | 5/1994 | Noble, Jr. et al. | 165/1 |
| 5,310,076 A | 5/1994 | Burton et al. | 220/377 |
| 5,313,156 A | 5/1994 | Klug et al. | 324/158 |
| 5,315,240 A | 5/1994 | Jones | 324/158 |
| 5,360,348 A | 11/1994 | Johnson | 439/72 |
| 5,373,893 A | 12/1994 | Eisenmann et al. | 165/65 |
| 5,400,904 A | 3/1995 | Maston, III et al. | 206/329 |
| 5,420,521 A | 5/1995 | Jones | 324/760 |
| 5,427,536 A | 6/1995 | Petersen et al. | 439/71 |
| 5,473,978 A | 12/1995 | Colombo | 99/443 |
| 5,523,678 A | 6/1996 | Mitsui | 324/158.1 |
| 5,528,159 A | 6/1996 | Charlton et al. | 324/758 |
| 5,584,707 A | 12/1996 | Volz et al. | 439/72 |
| 5,807,066 A | 9/1998 | Smith | 414/802 |
| 5,821,505 A | 10/1998 | Tustaniwskyj et al. | 219/548 |
| 5,834,946 A * | 11/1998 | Albrow et al. | 324/760 |
| 5,844,208 A | 12/1998 | Tustaniwskyj et al. | 219/494 |
| 5,846,375 A | 12/1998 | Gilchrist et al. | 156/345 |
| 5,847,293 A | 12/1998 | Jones | 73/865.8 |
| 5,847,366 A | 12/1998 | Grunfeld | 219/497 |
| 5,859,540 A | 1/1999 | Fukumoto | 324/760 |
| 5,966,940 A | 10/1999 | Gower et al. | 62/3.3 |
| 6,024,526 A | 2/2000 | Slocum et al. | 414/226.01 |
| 6,322,626 B1 * | 11/2001 | Shirley | 118/73 |

OTHER PUBLICATIONS

Patent Abstracts of Japan, vol. 018, No. 420 (P–1782), Aug. 5, 1994 & JP 06 130121 A (Fuji Electric Co Ltd.). May 13, 1994 abstract.

Patent AbstractsofJapan, vol.1999, No. 03, Mar. 31, 1999 & JP 10 321684A (PFU Ltd.), Dec. 4, 1998 abstract.

Patent Abstractsof Japan, vol. 2000, No. 01, Jan. 31, 2000 &JP 11 274384 A (CANON Inc.), Oct. 8, 1999 abstract.

* cited by examiner

METHODS AND APPARATUS FOR TESTING A SEMICONDUCTOR STRUCTURE USING IMPROVED TEMPERATURE DESOAK TECHNIQUES

BACKGROUND OF THE INVENTION

Semiconductor manufacturers typically test their semiconductor devices prior to shipping. Such tests may involve electrically probing and exercising the semiconductor devices under a variety of thermal conditions (e.g., over a wide temperature range) to identify faulty devices, to find out-of-tolerance devices and to categorize the devices into various grades (e.g., according to maximum operating speed, according to the amount of usable memory, etc.).

Such testing is useful for a variety of reasons. For example, in some situations, a manufacturer may be able to detect and repair faulty or out-of-tolerance devices (e.g., cure minor defects using a laser at a repair station) thus improving manufacturing yields. Additionally, the manufacturer may be able to charge a premium for devices having exceptionally high maximum operating speeds and/or exceptional amounts of usable memory.

Some manufacturers employ an automated test equipment (ATE) handling system (or simply "handler") to test semiconductor devices. Some handlers are capable of testing an assemblage having multiple semiconductor devices attached thereto, e.g., lead frames that support multiple electrically-isolated and packaged integrated circuit (IC) devices, strips of devices having Ball Grid Array (BGA) packages, configurations of other chip scale packaging (CSP) devices, and the like. A well-known general term for such an assemblage is "a panel".

A typical handler includes a temperature soak assembly, a test assembly, a temperature desoak assembly, and robotic equipment which moves panels from one assembly to another in a pipelined manner. In general, the temperature soak assembly is configurable to raise or lower the temperature of the panels to a predetermined temperature (a process commonly known as "temperature soaking") prior to testing. The test assembly is typically capable of testing the semiconductor devices of the panels while maintaining the panels at the predetermined temperature (e.g., by lowering a bed of nails onto particular locations of the panels to test the devices individually). The temperature desoak assembly is typically an area of the handler where the temperature soaked and tested panels reside while returning back to a temperature which is suitable for further processing and handling (a process commonly known as "temperature desoaking"). For example, the temperature soaked and tested panels can be moved to a location where they are simply allowed to idly sit and move to a near-ambient temperature (e.g., near room temperature) in an inactive manner.

Typically, at any one particular time, a manufacturer configures a handler to exclusively perform either a low temperature test or a high (or elevated) temperature test. In the low temperature test, the manufacturer configures the temperature soak assembly of a handler to lower the temperature of the panels to a predetermined low temperature (e.g., −55 degrees Celsius). For example, the manufacturer can connect cooling members of the temperature soak assembly to a cooling source (e.g., to a cryogenic source such as liquid nitrogen, to a refrigerant or cold oil circulator, etc.). Accordingly, panels sitting on the cooling members of the temperature soak assembly move to the predetermined low temperature from their initial temperature (e.g., room temperature, ambient factory temperature, etc.). During low temperature testing, the robotic equipment moves a temperature soaked panel (i.e., cooled panels) from the temperature soak assembly to the test assembly, and lowers a bed of nails onto the panel to individually test the devices of the panel. The robotic equipment then moves the cooled and tested panel from the test assembly to the temperature desoak assembly. A typical approach to heating up the cooled and tested panel in the temperature desoak assembly is to let the panel simply absorb heat from the surroundings (i.e., to idly sit at room temperature in an inactive manner). After the panel moves to a safe handling temperature, the panel is ready for further processing, e.g., the manufacturer can then reconfigure the handler to perform high temperature testing, or move the panels to a similar handler that is already configured for high temperature testing.

In the high temperature test, the manufacturer configures a temperature soak assembly of a handler to raise the temperature of the panels to a predetermined high temperature (e.g., 155 degrees Celsius). For example, the manufacturer can power heating elements within the temperature soak assembly to raise the temperature of the panels to the predetermined high temperature. During high temperature testing, the robotic equipment moves a heated panel from the temperature soak assembly to the test assembly, and lowers a bed of nails onto the panel for electrical testing. The robotic equipment then moves the heated and tested panel from the test assembly to the temperature desoak assembly so that the panel can cool down for further processing (e.g., labeling and storage in gravity feed handlers or other device-carriers, etc.). A typical approach to cooling down the heated and tested panel is to let them simply dissipate heat into the surroundings (i.e., placing the panel in a room temperature environment to idly cool down close to room temperature in an inactive manner).

If the manufacturer attempts to handle the heated and tested panels before the panels have significantly cooled, the manufacturer runs the risk of damaging the panels and/or the handling and processing equipment.

One conventional handler does not wait for panels to move back to a suitable handling temperature by simply exposing the panels back to a room temperature environment in an idle manner. Rather, the temperature desoak assembly of that handler includes a set of thermo-electric elements (i.e., ceramic or plastic electronic components) that actively heat or cool the panels. Each thermo-electric element has a first side and a second side, and receives direct current. When the direct current flows in a first direction through the thermo-electric elements, the first sides of the elements become hot and the second sides become cold. However, when the direct current flows in a second direction through the thermo-electric elements (i.e., the direction opposite the first direction), the first sides of the elements become cold and the second sides become hot.

The operation of the above-described conventional handler with thermo-electric elements will now be described. During a low temperature test, the thermo-electric elements of the temperature desoak assembly receive current in the first direction so that the first sides of the elements become hot. The robotic equipment of the handler moves cooled and tested panels from the test assembly of the handler onto the first sides of the thermo-electric elements to heat them up to a suitable handling temperature. Since the first sides of the thermo-electric elements are hot, the panels reach a suitable handling temperature more quickly than they would if simply exposed to a room temperature environment to idly warm up in an inactive manner, i.e., to simply absorb heat from the surrounding room temperature environment.

Similarly, during a high temperature test, the thermo-electric elements receive current in the second direction so that the first sides of the elements become cold. Accordingly, the robotic equipment of the handler moves heated and tested panels from the test assembly onto the first sides of the thermo-electric elements to cool them down to a suitable handling temperature. Since the first sides of the thermo-electric elements are cold, the panels reach a suitable handling temperature more quickly than they would if simply exposed to a room temperature environment to idly cool off in an inactive manner, i.e., to simply dissipate heat to the surrounding room temperature environment.

Recall that the second sides of the thermo-electric elements become hot in order for the first sides to become cold. To facilitate heat dissipation from the second sides of the thermo-electric elements, the manufacturer can mount heat sinks to the second sides of the thermo-electric elements. In such a situation, the thermo-electric elements reside between the heated and tested panels and the heat sinks. That is, the thermo-electric elements physically separate the heated and tested panels from the heat sinks with the cold first sides of the thermo-electric elements facing the heated and tested panels, and the hot second sides facing the heat sinks. An automated test equipment handling system, which is similar to the above-described handler having thermo-electric elements, is provided by Micro Component Technology, Inc. of St. Paul, Minn.

SUMMARY OF THE INVENTION

Unfortunately, there are deficiencies to the above-described approaches to thermally conditioning and testing panels within a handling system. For example, the approach of allowing panels to idly temperature desoak in an inactive manner (e.g., allowing the panels to simply dissipate or absorb heat by placing them in a room temperature environment for a period of time) requires an excessive amount of time and can thus become a bottleneck to throughput of the handler. That is, panels that are temperature desoaking (i.e., cooling off or heating up) in the temperature desoak assembly prevent other panels which have been temperature soaked and tested from exiting the testing assembly thus limiting the overall number of panels that can be tested by the handler in a particular amount of time.

To avoid such a bottleneck, a manufacturer may consider handling the panels without temperature desoaking them (i.e., before the panels have reached a safe and acceptable handling temperature). Unfortunately, handling the panels before they reach an acceptable handling temperature can result in damage to handling equipment and/or the panels themselves. For example, after a high temperature test, if panels are removed from the temperature desoak assembly prematurely and placed on a rubber conveyor assembly (e.g., for further processing at another station), the panels may still be hot enough to melt portions of the conveyor (e.g., rubber belts) thus destroying the conveyor and possibly damaging the panels (e.g., contaminating the panels with melted rubber). Also, the panels may still be too hot for further processing such as for marking (e.g., using a laser) or inspection (e.g., lead/ball inspection). Alternatively, after a low temperature test, the panels may be too cold causing excessive condensation (moisture) to accumulate over packaging of individual devices within the panels making the devices unsuitable for immediate subsequent processing.

Additionally, in the above-described conventional handler having a set of thermo-electric elements, running the thermo-electric elements (as well as cooling the thermo-electric elements when the thermo-electric elements temperature desoak panels after an elevated temperature test) increases the power consumed by the handler. Furthermore, cooling the thermo-elements after an elevated temperature test has an undesirable result of dissipating more heat into the factory. In some situations (e.g., when the handler powers heating elements in the temperature soak assembly to heat panels prior to testing) the additional power requirements of the thermo-electric elements makes the power requirements of the handler, as a whole, excessive and perhaps even impractical. Moreover, thermo-electric systems (i.e., the thermo-electric elements and related control and power circuitry) typically are complex and expensive devices which increase the overall cost and complexity of the handler, and such elements often require periodic maintenance or replacement.

Furthermore, some manufacturers may consider simply blowing air from the external surroundings of the handler over the panels to temperature desoak the panels more quickly than simply allowing the panels to idly sit in still air and temperature desoak (i.e., absorb or dissipate heat). Unfortunately, the air from the external surroundings of the handler can be significantly higher in moisture and dust content than the air within the temperature soak and test assemblies, and blowing such air risks generating condensation on the panels and/or contaminating the panels with dirt. Accordingly, simply blowing air from the surroundings over the panels is typically avoided.

Additionally, some manufacturers may be tempted to rest heat soaked and tested panels on a base, and apply a coolant (e.g., a cryogen, a refrigerant, a cold oil, etc.) through the base to cool the panels. Although such a coolant is often used in temperature soak assemblies for low temperature testing, using such a coolant in a temperature desoak assembly for temperature desoaking in a high temperature test can be somewhat excessive for a temperature desoaking task. For example, it can be extremely cumbersome to haul out and hookup a tank containing a cryogen such as liquid nitrogen. Additionally, using such a cryogen can be extremely messy (e.g., due to frost build up at the hookup point). Also, the use of a cryogen raises the possibility of causing serious human injury (e.g., cold burns) if handled improperly. Furthermore, since liquid nitrogen at room temperature becomes nitrogen gas which can displace breathable oxygen, the use of liquid nitrogen requires additional expensive precautions (e.g., gas sensors, alarms, special employee training, etc.). Additionally, refrigerant systems are complex and expensive to use and maintain. Accordingly, manufacturers can be reluctant to cool down heated and tested panels using a base through which coolant circulates.

In contrast to the above-described approaches to handling panels within a handling system, the present invention is directed to techniques for processing a semiconductor structure using a heat sink which defines a surface which is configured to thermally couple with the semiconductor structure. As such, temperature desoaking of the semiconductor structure can simply involve directing a fluid (e.g., factory air) over the heat sink to bring the temperature of the heat sink (and thus the semiconductor structure) toward the temperature of the fluid (e.g., toward room temperature) making the semiconductor structure safe for further handling and processing. Such techniques can desoak the semiconductor structure more quickly (i.e., at a faster rate) than simply waiting for the semiconductor structure to idly desoak in an inactive manner (i.e., dissipate or absorb heat while simply sitting in a room temperature environment).

Additionally, such techniques require less power than the earlier-described conventional handler that requires powering a set of thermo-electric elements.

One arrangement of the invention is directed to a semiconductor handling system having: (a) a temperature soak assembly to temperature soak a semiconductor structure (e.g., a panel); (b) a test assembly to test the semiconductor structure; and (c) a temperature desoak assembly to temperature desoak the semiconductor structure. The temperature desoak assembly includes (i) a heat sink that defines a surface which is configured to thermally couple with the semiconductor structure, (ii) a fluid guide coupled to the heat sink, and (iii) a fluid controller coupled to the fluid guide. The fluid controller provides a fluid (e.g., room temperature air) which the fluid guide directs over the heat sink to bring a temperature of the heat sink to a temperature of the fluid. This arrangement provides an effective low cost and low power means for temperature desoaking a semiconductor structure. Use of the heat sink facilitates temperature change of the semiconductor structure (heat absorption or heat dissipation) more quickly than desoaking the semiconductor structure by simply exposing the semiconductor structure to a room temperature environment and allowing them to idly sit for a period of time.

It should be understood that the thermal heat-transfer resistance between the semiconductor structure and the heat sink (e.g., a flat metal surface) is much lower than that between the semiconductor structure and air. In particular, for a solid-to-solid surface contact, the thermal resistance can be approximately of the order 0.00033 m^2degC/W. In comparison, for a solid-to-air contact, the thermal resistance can be closer to 0.02 m^2 degC/W. Accordingly, temperature desoaking the semiconductor structure through the heat sink is superior to simply waiting for the semiconductor structure to idly exchange heat with the surrounding air.

In one arrangement, the fluid controller of the temperature desoak assembly includes a fan assembly that generates an air stream which the fluid guide directs over the heat sink. The use of air as the fluid alleviates the need for using potentially hazardous and expensive materials such as a cryogen (e.g., liquid nitrogen which can cause human injury if handled improperly and which can become nitrogen gas that displaces oxygen) or a refrigerant, which some manufacturers may be tempted to use to desoak heated and tested panels.

In one arrangement, the surface defined by the heat sink is substantially planar, and the fluid guide is configured to guide the air stream (e.g., room temperature air) over the heat sink in a direction that is substantially perpendicular to the surface defined by the heat sink. This arrangement enables heat-transfer enhancement since the substantially perpendicular angle of incidence results in (i) a high level of mixing and turbulence and (ii) a thorough application of the air stream to the heat sink. In other arrangements, the air stream flows down the length of the heat sink, and/or the air stream through the heat sink substantially results in a laminar flow.

In one arrangement, the fluid guide includes a shroud coupled to the heat sink. The shroud of the fluid guide and the heat sink define a chamber to substantially prevent air of the air stream from directly reaching the semiconductor structure. Accordingly, any moisture or debris (dust, dirt, etc.) in the air of the air stream can be prevented from escaping the chamber and contaminating the semiconductor structure. Preferably, the air of the air stream does not directly mix with controlled test air directly surrounding the semiconductor structure when the semiconductor structure is within the temperature soak assembly, the test assembly and the temperature desoak assembly.

In one arrangement, the fluid guide defines an air stream input port at a first location, and an air stream output port at a second location. Although the first and second locations can be near each other, the first and second locations are preferably separated from each other and/or the output port directs the air stream away from the input port so that there is little or no direct recycling of the exhaust air back into the temperature desoak assembly. For example, in one arrangement, the first location has a height that is lower than that of the second location. Since hot air tends to rise, the air entering the fluid guide at the first location (i.e., the lower location) tends to be lower in temperature thus improving the temperature lowering capabilities of the temperature desoak assembly when desoaking heated and tested semiconductor structures.

In one arrangement, the fan assembly of the fluid controller includes a first fan, coupled to the input port defined by the fluid guide, that blows air of the air stream toward the heat sink; and a second fan, coupled to the output port defined by the fluid guide, that draws air of the air stream away from the heat sink. This arrangement provides a consistent air stream with adequate air pressure throughout (e.g., with minimal air pressure losses). In other arrangements, the fan assembly includes other fan configurations (e.g., multiple fans at the input port, multiple fans at the output port, one or more fans in intermediate portions of the fluid guide, combinations thereof, etc.).

In one arrangement, the semiconductor handling system further includes a set of heating elements, embedded within the heat sink, to raise the temperature of the heat sink. The heating elements enable the system to temperature desoak the semiconductor structure more quickly after a low temperature test.

In one arrangement, the first and second fans of the fan assembly run only during an elevated temperature test in order to cool the semiconductor structure. In another arrangement, the first and second fans of the fan assembly are configured to provide the air stream regardless of whether the temperature of the heat sink is higher or lower than a temperature of the air stream. In this other arrangement, when the temperature of the heat sink is higher than the temperature of the air stream (e.g., due to a heated and tested semiconductor structure thermally coupled thereto), the fan assembly removes heat from the semiconductor structure to temperature desoak the semiconductor structure. When the temperature of the heat sink is lower than the temperature of the air stream (e.g., due to a cooled and tested semiconductor structure thermally coupled thereto), the fan assembly can provide heat to the semiconductor structure to temperature desoak the semiconductor structure. If the handling system employs heating elements to temperature desoak the semiconductor structure after a sub-ambient temperature test, the fans can still be operated in order to prevent the exhaust air from the temperature desoak assembly from getting too cold (a potential annoyance to users of the semiconductor handling system, bystanders, etc.).

In one arrangement, the fluid controller further includes an air filter, proximate to the input port defined by the fluid guide, to filter air of the air stream. Accordingly, debris such as dirt and dust can be removed from the air of the air stream thus preventing such debris from clogging the heat sink and interfering with air flow.

The features of the invention, as described above, may be employed in handling systems, devices and methods, as well as other ATE apparatus, such as those of Teradyne, Inc. of Boston, Mass.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed to techniques for processing a semiconductor structure (e.g., a panel) using a heat sink which defines a surface which is configured to thermally couple with the semiconductor structure. As such, temperature desoaking of the semiconductor structure can simply involve directing a fluid (e.g., factory air) over the heat sink to bring the temperature of the heat sink (and thus the semiconductor structure) toward the temperature of the fluid (e.g., toward room temperature) making the semiconductor structure safe for further handling and processing. Such techniques can desoak the semiconductor structure more quickly than simply waiting for the semiconductor structure to idly desoak in an inactive manner (i.e., dissipating or absorbing heat while simply sitting in a room temperature environment). Additionally, such techniques require less power than the earlier-described conventional handler that requires powering a set of thermo-electric elements.

Figure 1:
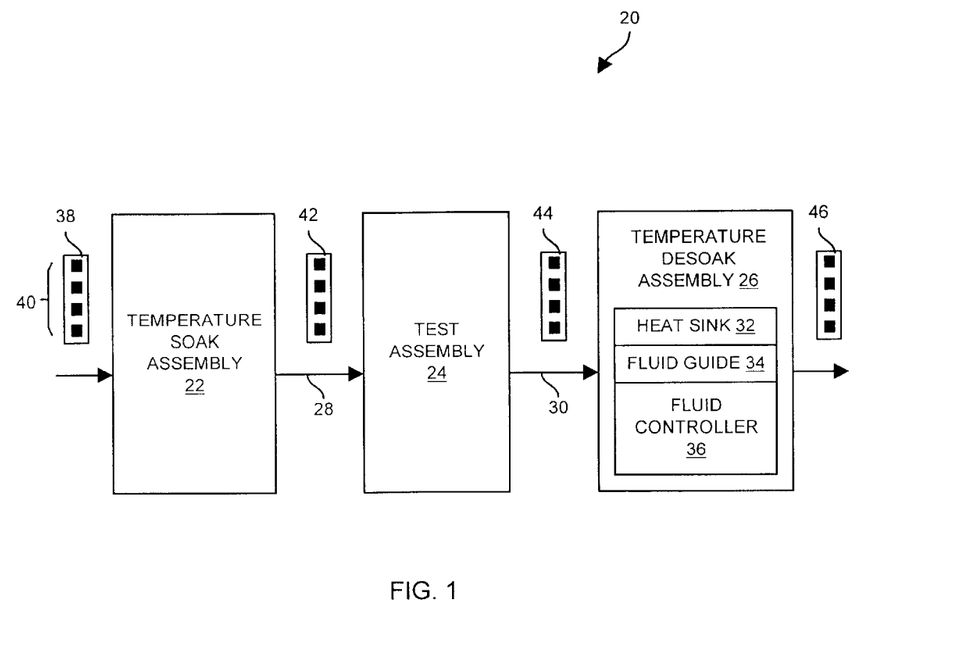
FIG. 1 is a block diagram of a semiconductor handling system which is suitable for use by the invention.

FIG. 1 shows a semiconductor handling system 20 (hereinafter simply referred to as the test system 20) which is suitable for use by the invention. The test system 20 includes a temperature soak assembly 22 for temperature soaking semiconductor structures, a test assembly 24 for testing semiconductor structures, and a temperature desoak assembly 26 for temperature desoaking semiconductor structures. The test system 20 is configured to test semiconductor structures (e.g., panels) in a pipelined manner. To this end, the test system 20 further includes a first transport mechanism 28 (e.g., robotics) which is configured to transfer temperature soaked semiconductor structures from the temperature soak assembly 22 to the test assembly 24 for testing. The test system 20 further includes a second transport mechanism 30 (e.g., additional robotics) which is configured to transfer temperature soaked and tested semiconductor structures from the test assembly 24 to the test desoak assembly 26 for temperature desoaking.

As shown in FIG. 1, the temperature desoak assembly 26 includes a heat sink 32, a fluid guide 34 and a fluid controller 36. An aluminum bonded-fin heat sink (e.g., part number 420014-U-4-1100 by Aavid Thermal Technologies of Laconia, N.H.) is suitable for use as the heat sink 32.

As will be described in further detail below, the temperature desoak assembly components 32, 34, 36 enable the test system 20 to temperature desoak the semiconductor structures more quickly than simply waiting for the semiconductor structure to desoak in an inactive manner (i.e., dissipate or absorb heat while simply sitting idle in a room temperature environment). Additionally, such components 32, 34, 36 require less power than the earlier-described conventional handler that requires powering a set of thermo-electric elements.

By way of example, FIG. 1 shows a semiconductor structure 38 having multiple semiconductor devices 40 (e.g., individually packaged and electrically isolated ICs). As mentioned above, the test system 20 handles the semiconductor structure 38 in a pipelined manner. In particular, the temperature soak assembly 22 initially temperature soaks the semiconductor structure 38 to a predetermined temperature (e.g., 155 degrees Celsius for a high temperature test, −55 degrees Celsius for a low temperature test) to form a fully temperature soaked semiconductor structure 42. The first transport mechanism 28 then transfers the semiconductor structure 42 from the temperature soak assembly 22 to the test assembly 24 where it is tested thus forming a temperature soaked and tested semiconductor structure 44. The second transport mechanism 30 then transfers the temperature soaked and tested semiconductor structure 44 from the test assembly 24 to the temperature desoak assembly 26 where it is temperature desoaked to a predetermined temperature range (e.g., between 20 and 50 degrees Celsius) thus forming a temperature desoaked semiconductor structure 46 which is suitable for further handling and processing. Further details of the invention will now be provided with reference to FIG. 2.

Figure 2:
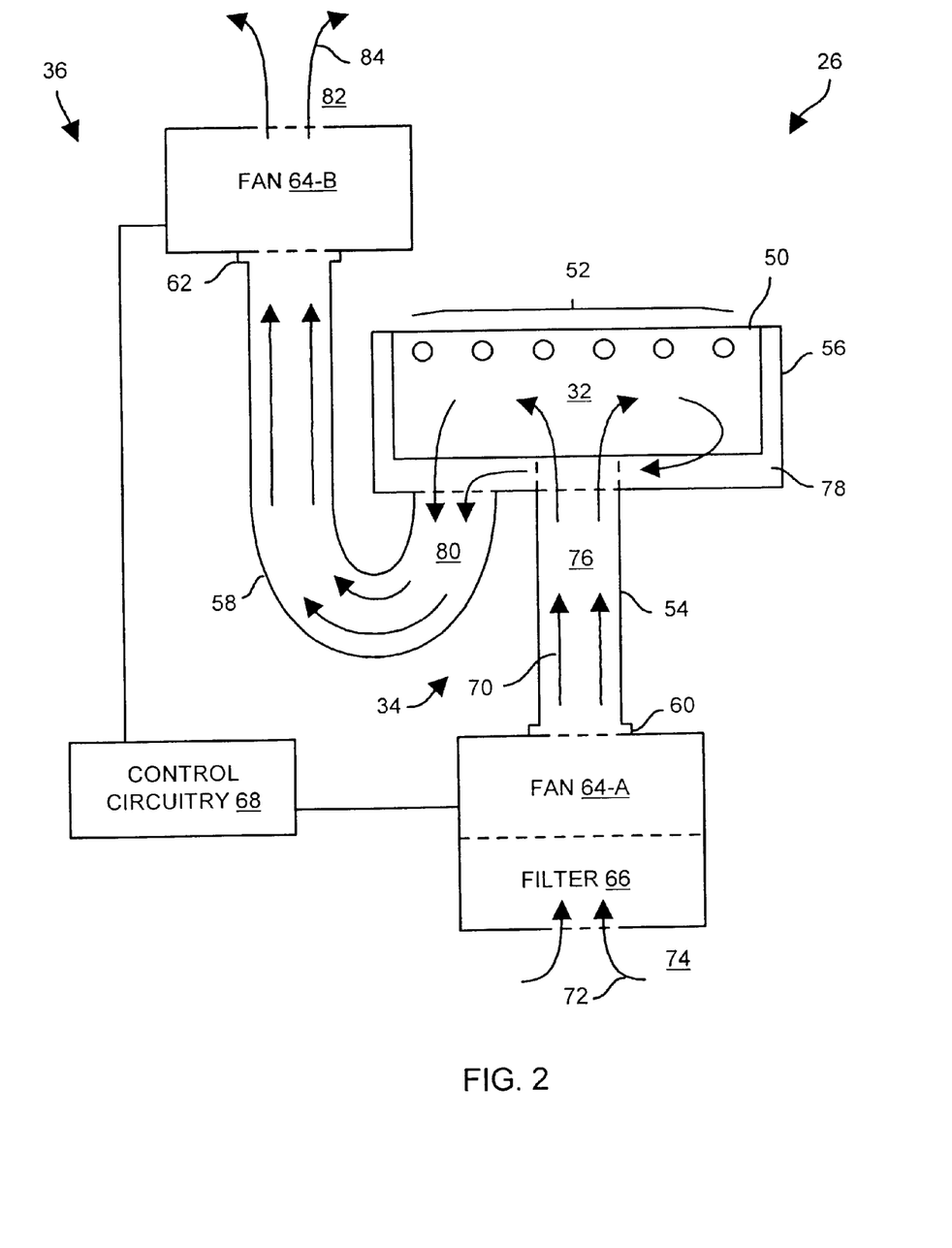
FIG. 2 is a cross-sectional side view of a temperature desoak assembly of the semiconductor handling system of FIG. 1.

FIG. 2 is a cross-sectional side view of the temperature desoak assembly 26 of the test system 20. The heat sink 32 defines a surface 50 which is configured to thermally couple with the temperature soaked and tested semiconductor structures 44 (also see FIG. 1) exiting the test assembly 24. Accordingly, the heat sink 32 temperature desoaks the semiconductor structures 44 in a conduction-based manner (i.e., by passing an air stream through the heat sink 32 which is in thermal communication with the semiconductor structures 44). In one arrangement, the heat sink 32 is configured to receive and hold a set of heating elements 52 which, when powered, increases the temperature of the heat sink 32 in order to raise the temperature of the semiconductor structures 44 undergoing temperature desoaking after a low temperature test.

As further shown in FIG. 2, the fluid guide 34 includes a supply duct 54, a shroud 56 and a discharge duct 58. One end of the supply duct 54 defines an air stream input port 60, and the other end couples to the shroud 56. Similarly, one end of the discharge duct 58 couples to the shroud 56 and the other end defines an air stream output port 62.

Additionally, as shown in FIG. 2, the fluid controller 36 includes a first fan 64-A coupled to the input port 60, a second fan 64-B coupled to the output port 62, an air filter 66 adjacent the first fan 64-A, and control circuitry 68. The control circuitry 68 preferably controls the operation of the first and second fans 64-A, 64-B (collectively, fans 64).

During operation of the test system 20, the computerized circuitry 68 powers the fans 64 such that the fans 64 generate an air stream 70 which passes through the components 54, 56, 58 of the fluid guide 34 in order to bring the temperature of the heat sink 34 toward a temperature of the air stream 70. That is, the first fan 64-A draws air 72 at a location 74 near the input port 60 through the air filter 66 and blows it into the supply duct 54, e.g., see location 76. The supply duct 54 directs the air stream 70 into a chamber 78 defined by the shroud 56 and the heat sink 32. Preferably, the heat sink 32 includes heat exchange fins that promote heat exchange between the heat sink 32 and the air stream 70. Simultaneously, the second fan 64-B draws air from within the discharge duct 58, e.g., see location 80, and passes that air to a location 82 as exhaust air 84. In one arrangement, the locations 74 and 82 are outside a cabinet housing of the test system 20 so that the air of the air stream 70 is ducted outside the machine. Such an arrangement is essentially an open-loop air-based temperature desoak design which provides temperature desoaking using conduction to the semiconductor structure.

As the air stream 70 flows through the fluid guide 34, the air stream brings the temperature of the heat sink 32 toward to the temperature of the air stream 70. For example, when the test system 20 performs a high temperature test, the surface 50 of the heat sink 32 thermally couples to heated and tested semiconductor structures 44 exiting the test assembly 24 (also see FIG. 1). Accordingly, the temperature of the heat sink 32 increases by absorbing some of the heat from the semiconductor structures 44. The air stream 70 carries away that heat in order to lower the temperature of the heat sink 32 and ultimately the semiconductor structures 44.

In one arrangement, as shown in FIG. 2, the height of the input port 60 is lower than the height of the output port 62. Since warm air rises and since the output port 62 and the input port 60 are not at the same location, there is little or no direct recycling of the exhaust air 82 back into the temperature desoak assembly 26 (i.e., mixing of the discharged air and the intake air is substantially avoided). Rather, the temperature desoak assembly 26 tends to have an abundant supply of ambient factory air available, e.g., room temperature air (typically in a range between 20 and 30 degrees Celsius). Furthermore, when temperature desoaking heated and tested semiconductor structures 44 during high temperature testing, the air at location 74 tends to be slightly cooler than the air at location 84 and the use of slightly cooler air enables superior cooling than if air were drawn from a higher location. That is, cooler air is drawn in through the supply duct 54 (e.g., from near the factory floor) and warmer air is discharged upward and away from the intake.

The open-loop configuration of the temperature desoak assembly 26 enables the test system 20 to essentially tap into an abundant fluid source (i.e., factory air). As such, this open-loop configuration is simple and can operate at a relatively low cost with little servicing (e.g., without any need to refill a fluid source). That is, serviceability and repair are typically less difficult than closed-liquid-loop thermal systems (e.g., desoak equipment that uses refrigeration devices) which can require expensive, messy and often environmentally unfriendly heat-transfer fluids.

When the test system 20 performs a low temperature test, the temperature of the heat sink 32 decreases by supplying heat to cooled and tested semiconductor structures 44 exiting the test assembly 24. In some arrangements, the temperature desoak assembly 26 further includes a set of heating elements 52 (e.g., rod-shaped electric resistance heaters) which raise the temperature of heat sink 32 and ultimately the semiconductor structures 44. In such arrangements, the air stream 70 is not required during the low temperature test. Nevertheless, in one arrangement, the temperature desoak assembly 26 operates the fans 64 to generate the air stream 70 during the low temperature test in order to facilitate increasing the temperature of the heat sink 32 and ultimately the semiconductor structures 44. Another result of running the fans 64 while simultaneously powering the heating elements 52 is that the exhaust air 82 exiting the temperature desoak assembly 26 is not extremely cold and thus does not provide an annoyance to users (e.g., operators, technicians, etc.) adjacent the test system 20.

In one arrangement, the surface 50 defined by the heat sink 32 is substantially planar, and the direction of the air stream 70 is substantially perpendicular to the surface 50 (e.g., for compactness). Accordingly, the air stream 70 strikes the heat sink 32 at a high angle of incidence which provides a large amount of turbulence and mixing resulting in enhanced heat-transfer. In an alternative arrangement, the direction of the air stream 70 is along the length of the channels through the heat sink 32. In some situations, there is greater pressure drop when the direction of the air stream 70 is along the length of the channels thus making the arrangement that directs the air stream 70 substantially perpendicularly to the surface 50 (e.g., at the mid-point of the heatsink 32) a more attractive configuration.

It should be understood that the use of the above-described temperature desoak assembly 26 is a simple but effective means for temperature desoaking semiconductor structures at a faster rate than simply placing the semiconductor structures in a location to idly sit and desoak in an inactive manner. Using air as the temperature-transfer fluid is also effective and efficient since it is safe and available in abundant supply at desirable conditions (e.g., in a temperature range between 20 and 30 degrees Celsius). Additionally, the equipment of the temperature desoaking assembly 26 is typically less expensive than more complex configurations such as the earlier-described conventional handler which uses thermo-electric elements. Furthermore, the equipment of the temperature desoaking assembly 26 typically consumes less power than the earlier-described conventional handler which uses thermo-electric elements (and less power than other refrigerant-pumped cooling systems) thus making the test system 20 more practical for situations where power consumption may be constrained.

It should be further understood that the temperature desoak assembly 26 of the test system 20 is configured such that there is low risk of excessive condensation forming on semiconductor structures if there is a stoppage in the flow of semiconductors therethrough during an elevated temperature test. For example, during an elevated temperature test, if the robotics were to fail and stop moving semiconductor structures through the temperature desoak assembly 26, the ultimate temperature of the semiconductor structures is the factory ambient temperature (e.g., room temperature) thus limiting the amount of condensation (if any) that forms on the semiconductor structures. In contrast, the earlier-described panel handler which uses thermo-electric elements to cool off panels after an elevated temperature test can lower the temperature of the panel to such a low temperature that excessive and potentially damaging condensation could form on the panels. Further details of the invention will now be provided with reference to FIGS. 3 through 6.

Figure 3:
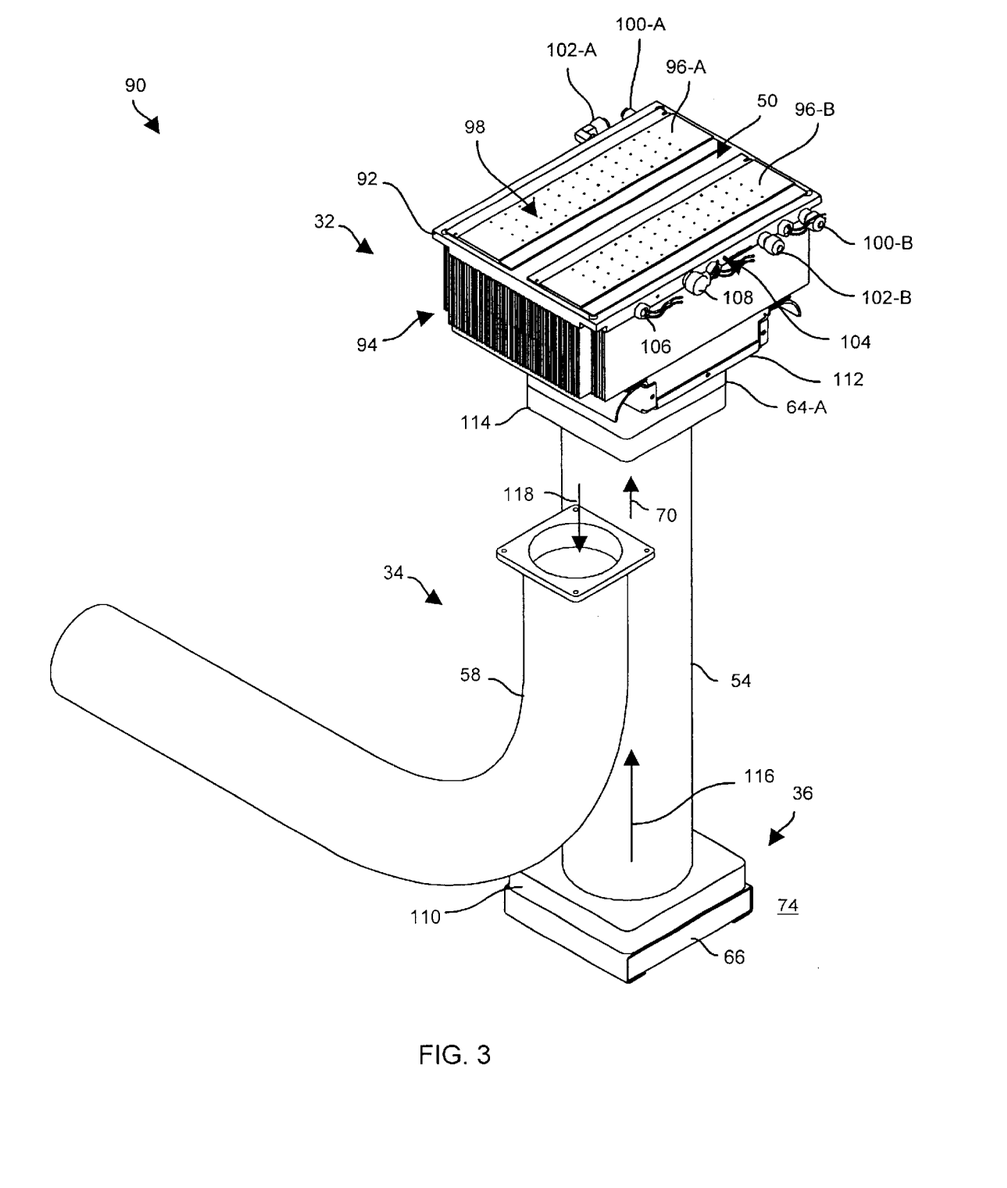
FIG. 3 is a perspective top view of portions of the temperature desoak assembly of FIG. 2.

FIG. 3 shows a perspective top view 90 of portions of the temperature desoak assembly 26. (The shroud 56 of the fluid guide 34 is omitted in FIGS. 3 through 6 in order to better illustrate other components of the temperature desoak assembly 26.) As shown, the heat sink 32 includes a base portion 92 and a finned portion 94. The base portion 92 defines the surface 50 which thermally couples to the temperature soaked and tested semiconductor structures 44 exiting the test assembly 24 (FIG. 1). In particular, a set of plates 96-A, 96-B (e.g., metal plates with high thermal conductivity) sit on the base portion 92 and defines vacuum holes 98 for attaching the semiconductor structures 44 thereto. In one arrangement, the pattern of the vacuum holes 98 is device specific, i.e., dictated by the particular configuration of devices 40 on the semiconductor structures (see FIG. 1). The set of plates 96-A, 96-B (collectively, the plates 96) keeps the semiconductor structures 44 in thermal communication with the base portion 92 of the heat sink 32. Accordingly, the temperature responses of the semiconductor structures 44, when placed in contact with the plates 96 (i.e. a constant-temperature environment), is exponential thus ensuring quick and effective temperature desoaking.

The base portion 92 includes a set of vacuum line fittings 100-A, 100-B to receive vacuum lines that provide a vacuum for attaching the plates 96-A, 96-B to the base portion 92, a set of vacuum line fittings 102-A, 102-B for attaching the semiconductor structures 44 to the plates 96-A, 96-B, a temperature sensor 104 for providing a temperature signal to the computerized circuitry 68 (see FIG. 2), a set of heaters 106 which form the set of heating elements 52 (FIG. 1), and a thermostatic switch 108 that operates as a safety measure (e.g., preventing thermal runaway). Embedding of the heaters 106 (e.g., rod-type electric resistance heaters) minimizes the size and thermal resistance between the finned portion 94 and the plates 96-A, 96-B. In some arrangements, the placement of the heaters 106 provides temperature uniformity and a predetermined heater power density. In some arrangements, the temperature desoak assembly 26 uses heating mechanisms other than the embedded heaters 106 such as a flat flexible heater (e.g., an etched foil heater) which is clamped to the heat sink base portion 92.

As further shown in FIG. 3, the supply duct 54 defines an inlet flange 110 and an outlet flange 114. In one arrangement, the inlet flange 110 defines the input port 60 of FIG. 2, and the first fan 64-A is disposed between the inlet flange 110 and the air filter 66. In an alternative arrangement, which is shown in FIG. 3, the input port 60 connects directly to the air filter 66 at the location 74 (i.e., at the input port 60), and the first fan 64-A is disposed between the outlet flange 114 and the heat sink 32. In both arrangements, the air filter 66 is preferably the first component along the air pathway through the fluid guide 34 in order to remove any contaminants from the air stream 70. As shown in FIG. 3, ambient factory air 116 passes through the supply duct 54 toward the heat sink 32, and heat-exchanged air 118 (air that is either hotter or colder than the ambient factory air 116 due to passing through the finned portion 94 of the heat sink 32) passes into and through the discharge duct 58.

In addition to the above-described fluid guide components, it should be understood that the fluid guide 34 can include other components as well, such as a coupling/flange 112 that connects the fan 64-A to the heat sink 32. As shown in FIG. 3, the coupling/flange 112 can be fabricated from a piece of sheet metal that is cut (e.g., stamped) and bent for strength, and a cover plate (not shown).

Figure 4:
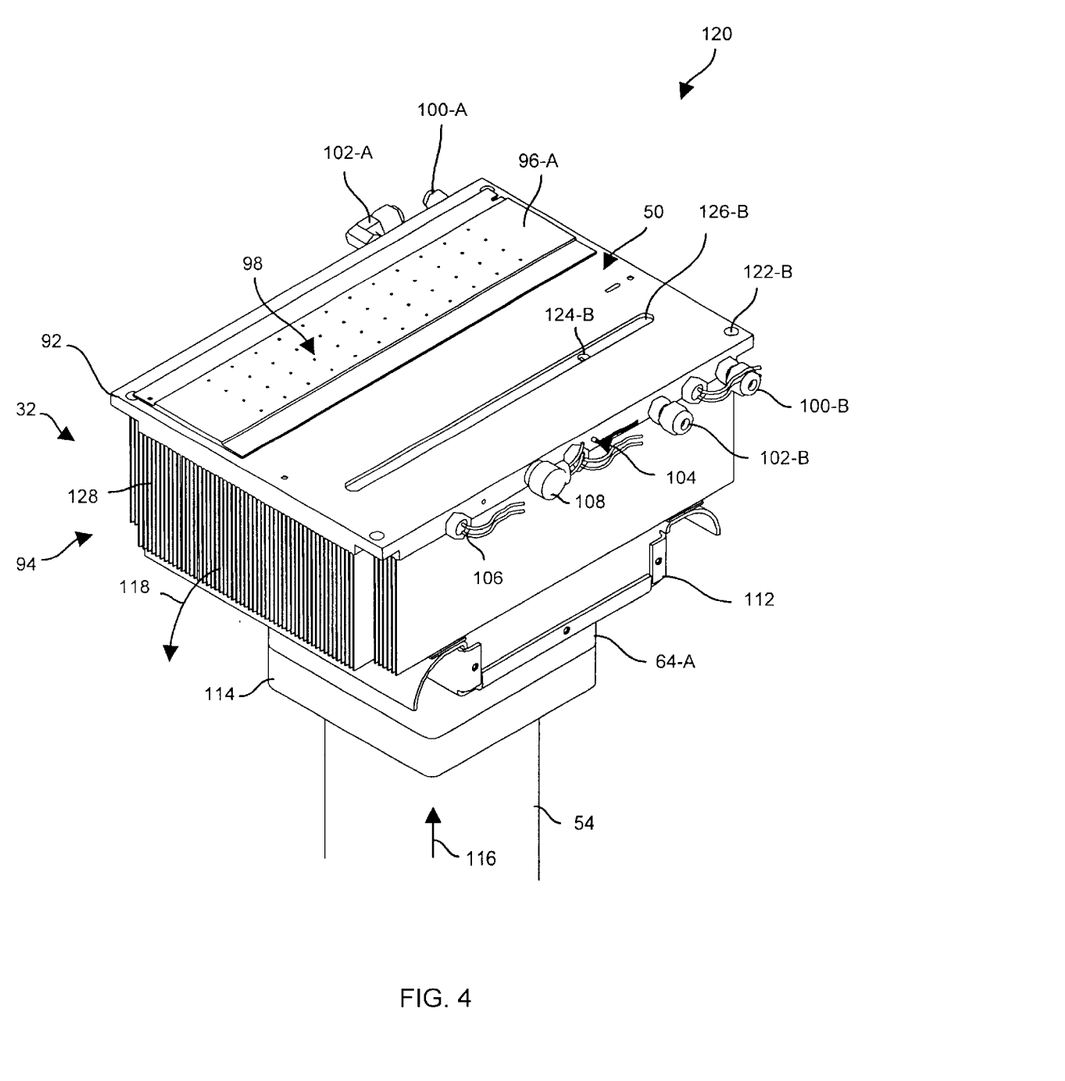
FIG. 4 is a detailed perspective view of portions of the temperature desoak assembly of FIG. 2.

FIG. 4 shows a detailed perspective view 120 of portions of the temperature desoak assembly 26. The view 120 of FIG. 4 is similar to the view 90 of FIG. 3. However, in FIG. 4, the plate 96-B has been removed to expose particular features of the heat sink 32. In particular, as shown in FIG. 4, the base portion 92 defines vacuum holes 122-B which connect to the vacuum line fitting 100-B in order to convey the vacuum from that fitting 100-B to the plate 96-B and hold the plate 96-B to the base portion 92. In a similar manner, the base portion 92 further defines a vacuum hole 124-B and a vacuum channel 126-B which connect to the vacuum line fitting 102-B in order to convey the vacuum from that fitting 102-B to the holes 98 defined in the plate 96-B and thus fasten a semiconductor structure 44 to the plate 96-B. The base portion 92 includes similar features which are hidden beneath the plate 96-A in order to fasten the plate 96-A to the base portion 92, and in order to attach another semiconductor structure 44 to the plate 96-A. Such connections occur through passages within the base portion 92 in a manifold-like manner (e.g., pre-drilled or routed passages, two routed plates sealed together, etc.).

Also shown in FIG. 4 are fins 128 of the finned portion 94 of the heat sink 32. The fins 128 thermally couple to the plates 96-A, 96-B (also see FIG. 3) through the base portion 92 and provide a large heat exchange surface area to promote heat transfer between the air stream 70 (see arrows 116, 118 in FIG. 4) and the heat sink 32.

Figure 5:
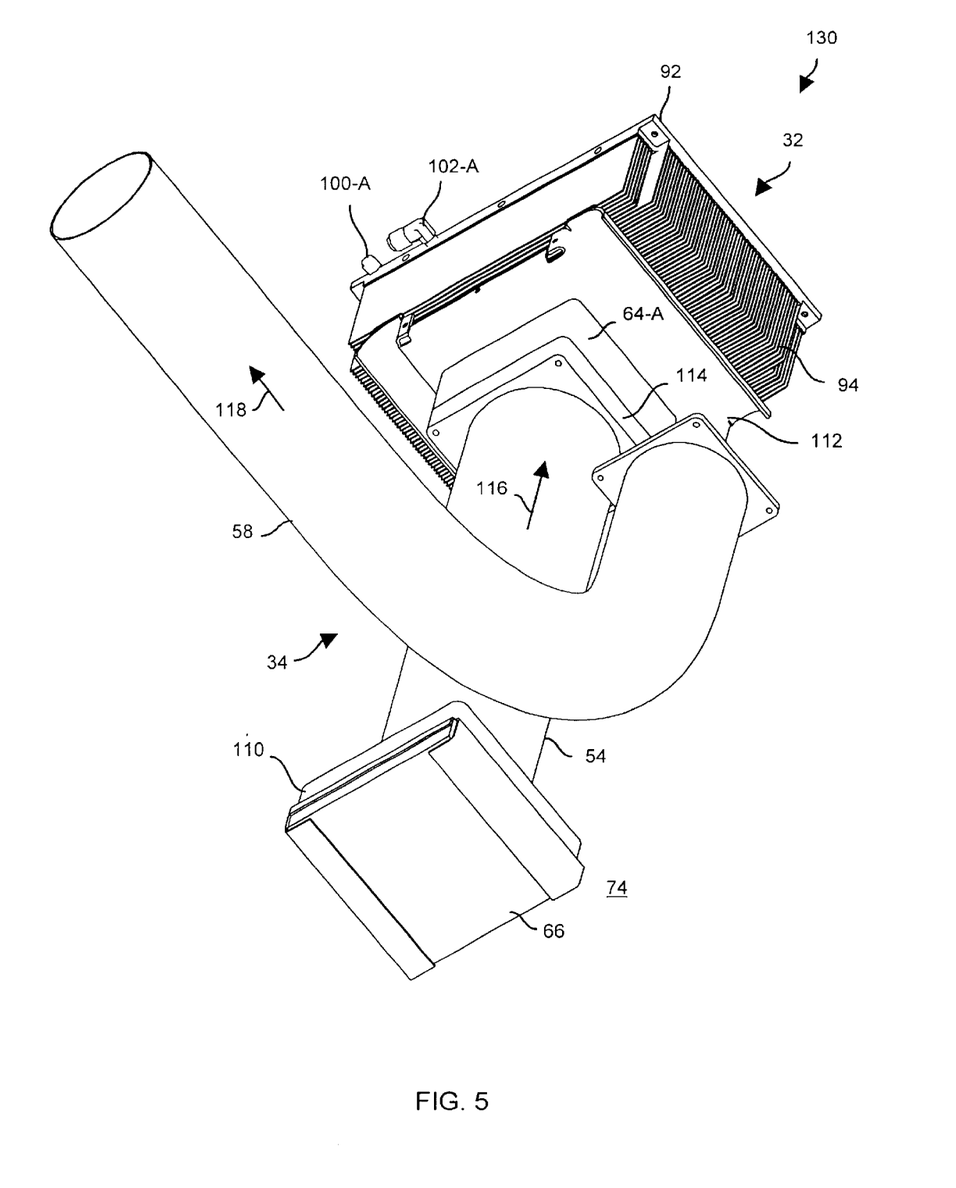
FIG. 5 is a perspective bottom view of portions of the temperature desoak assembly of FIG. 2.

FIG. 5 shows a bottom view 130 of portions of the temperature desoak assembly 26. As shown, the inlet flange 110 is configured to hold the air filter 66. The air filter 66 covers the opening to the air pathway of the fluid guide 34 thus effectively filtering air drawn through the fluid guide 34 by fans of the temperature desoak assembly 26 (e.g., see the fan 64-A disposed between the outlet flange 114 of the supply duct 54 and the heat sink 32).

Figure 6:
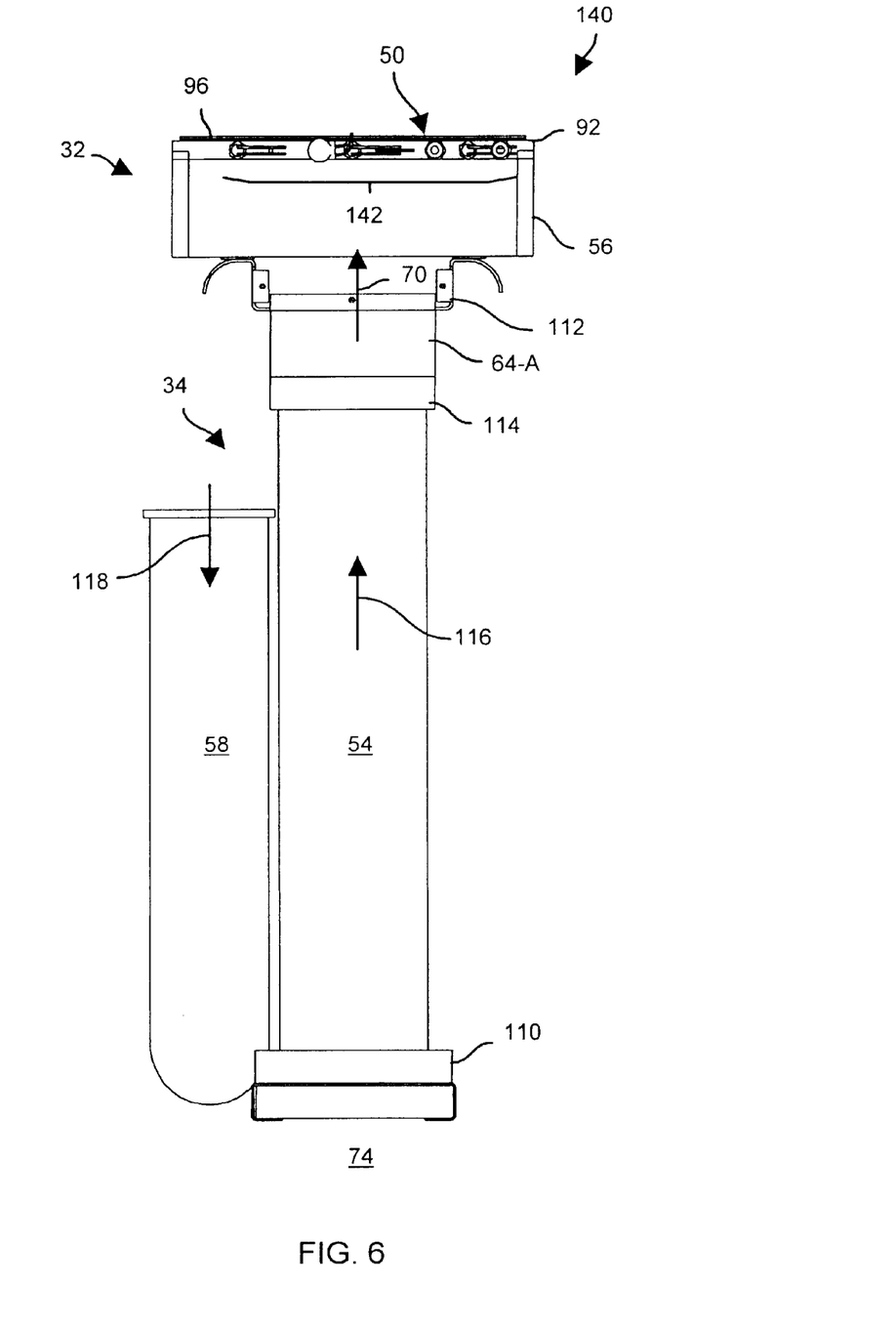
FIG. 6 is a side view of portions of the temperature desoak assembly of FIG. 2.

FIG. 6 shows a side view of portions of the temperature desoak assembly 26. As mentioned above and shown in FIG. 6, the surface 50 defined by the heat sink 32 can be substantially planar, and the direction of the air stream 70 can be substantially perpendicular to the surface 50. In such an arrangement, the air stream 70 strikes the heat sink 32 in a perpendicular manner resulting in a large amount of turbulence and mixing for enhanced temperature-transfer. As mentioned earlier, in an alternative arrangement, the direction of the air stream 70 is along the length of the ducts through the heat sink 32. In some situations, there is greater pressure drop when the direction of the air stream 70 is along the length of the ducts. Accordingly, the arrangement that directs the air stream 70 substantially perpendicularly to the surface 50 (e.g., at the mid-point of the heatsink 32) can be a more attractive configuration. Further details of the invention will now be provided with reference to FIG. 7.

Figure 7:
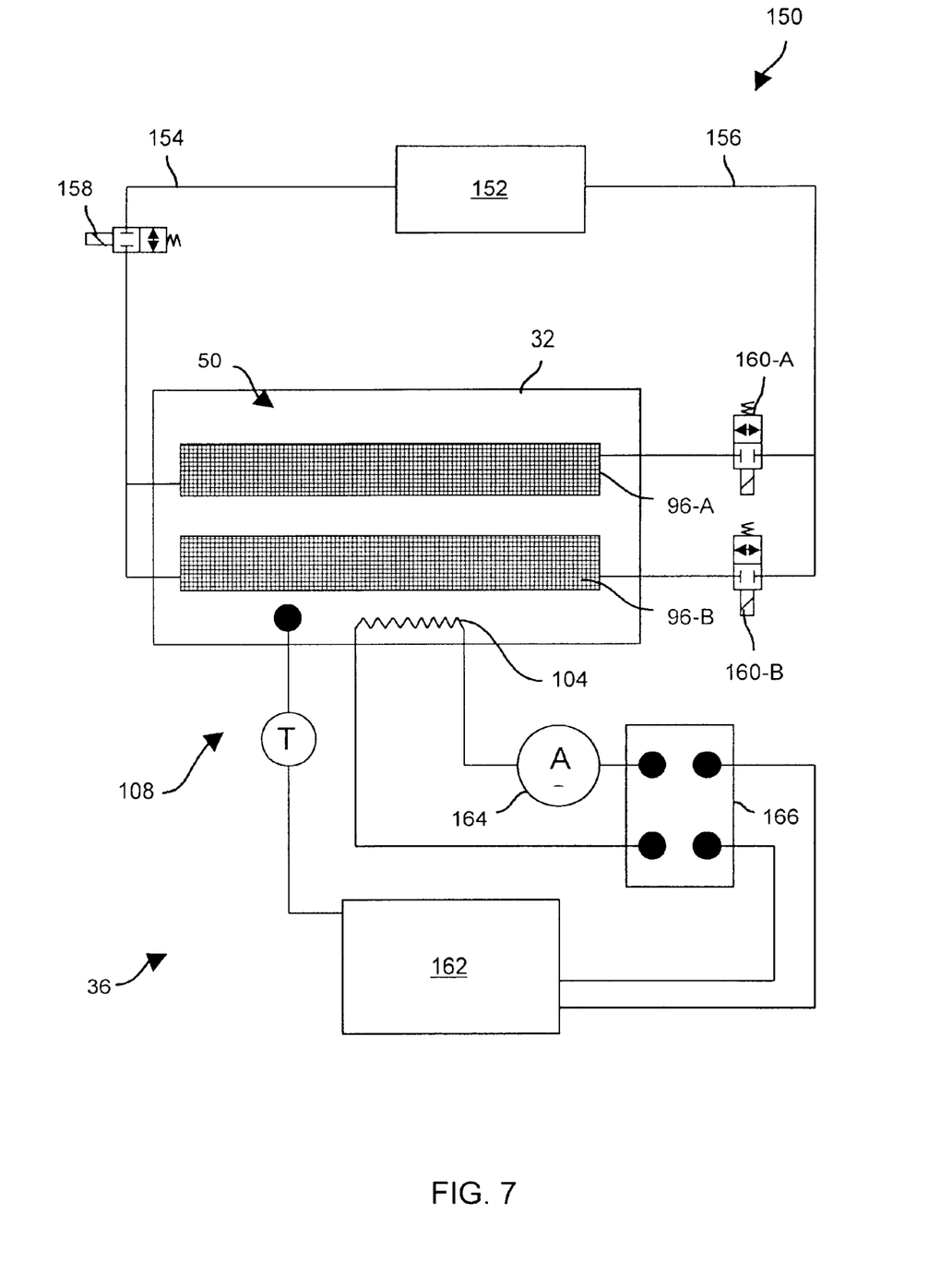
FIG. 7 is a schematic view of particular components of the temperature desoak assembly of FIG. 2.

FIG. 7 is a schematic view 150 of particular components of the temperature desoak assembly 26. As shown, the fluid controller 36 includes a vacuum source 152 and vacuum lines 154, 156 which connect the fluid source 152 to the heat sink 32 and the plates 96-A, 96-B on the surface 50 of the heat sink 32. The fluid controller 36 further includes control valves 158, 160-A, 160-B which control the vacuum through the vacuum lines 154, 156. In particular, the control valve 158 controls the vacuum through the vacuum line 154 which leads to the vacuum line fittings 100-A, 100-B for attaching the plates 96-A, 96-B to the surface 50 of the heat sink 32 (also see FIG. 3). Similarly, the control valves 160-A, 160-B control the vacuum through the vacuum line 156 which leads to the vacuum line fittings 102-A, 102-B for fastening semiconductor structures 44 (also see FIG. 1) to the plates 96-A, 96-B.

As further shown in FIG. 7, the fluid controller 36 also includes a computer 162, a power source 164 (e.g., an alternating-current power supply), and a switch 166 (e.g., a solid-state relay) that controls the heaters 104 (shown schematically as an electrical resistance-type heater). As shown, the computer 162 connects with the temperature sensor 108 (shown schematically as single line (T) to the heat sink 32). The temperature sensor 108 provides a feedback signal to the computer 162. When the test system 20 performs low temperature testing, the computer 162 is configured to power the heaters 104 so that the temperature of the heat sink 32 rises to a predetermined temperature (e.g., 50 degrees Celsius). Once the heat sink 32 reaches the predetermined temperature, the computer 162 operates the switch 166 to maintain the temperature of the heat sink 32 at a steady-state. For example, when the temperature of the heat sink 32 falls substantially below the predetermined temperature (e.g., by 5%), the computer 162 closes the switch 166 to power the heaters 104. Then, when the temperature of the heat sink 32 rises substantially above the predetermined temperature (e.g., by 5%), the computer 162 opens the switch 166 to turn off the heaters 104, and so on. Further details of the invention will now be provided with reference to FIG. 8.

Figure 8:
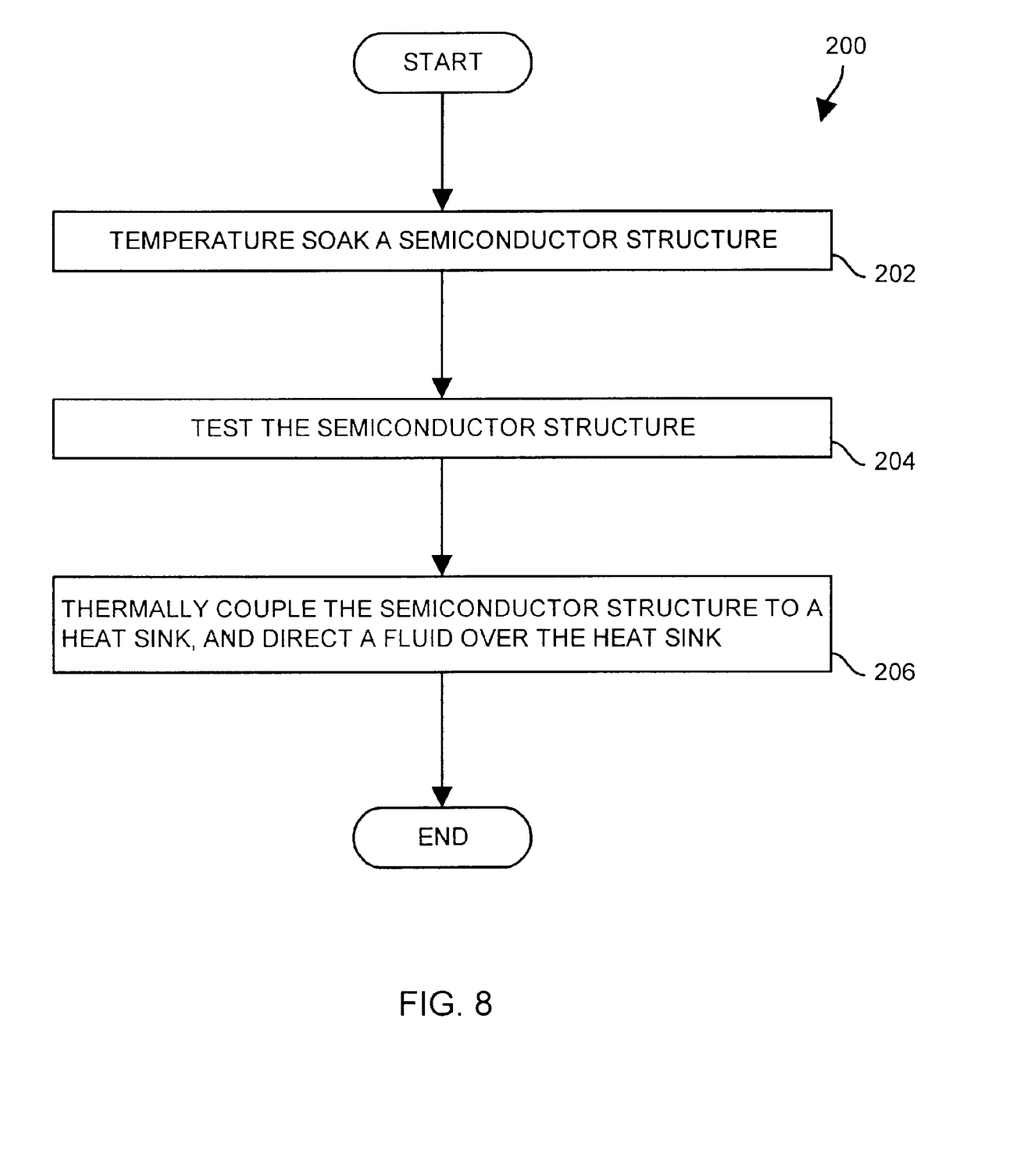
FIG. 8 is a flowchart of a procedure performed by the temperature desoak assembly of FIG. 2.

FIG. 8 shows a flowchart of a procedure 200 which is performed by the test system 20. In step 202, the temperature soak assembly 22 of the test system 20 temperature soaks a semiconductor structure 38 to form a temperature soaked semiconductor structure 42 (also see FIG. 1). For example, in a high temperature test, the temperature soak assembly 22 heats the semiconductor structure 38 to a predetermined high temperature (e.g., 155 degrees Celsius). In a low temperature test, the temperature soak assembly 22 cools the semiconductor structure 38 to a predetermined low temperature (e.g., −55 degrees Celsius). A transport mechanism 28 (e.g., robotics) of the test system 20 then conveys the temperature soaked semiconductor structure 42 to the test assembly 24.

In step 204, the test assembly 24 tests the semiconductor structure 42 (e.g., electrically exercises each device 40 of the semiconductor structure, also see FIG. 1) to form a temperature soaked and tested semiconductor structure 44. Preferably, the test assembly 24 maintains the temperature soaked and tested semiconductor structure 44 at the predetermined temperature during the test for consistent and reliable test results. Another transfer mechanism (e.g., additional robotics) of the test system 20 then conveys the temperature soaked and tested semiconductor structure 44 to the temperature desoak assembly 26.

In step 206, the temperature desoak assembly 26 temperature desoaks the temperature soaked and tested semiconductor structure 44 (FIG. 1) to form a temperature desoaked semiconductor structure 46 which is suitable for further handling and processing. For example, in a high temperature test, the temperature desoak assembly 26 cools the semiconductor structure 44 to a predetermined low temperature (e.g., 60 degrees Celsius). In a low temperature test, the temperature desoak assembly 26 heats the semiconductor structure 44 to a predetermined high temperature (e.g., 5 degrees Celsius).

The temperature desoaked semiconductor structure 46 resides in a predetermined temperature range which is suitable for safe handling and processing of the structure 46. For example, robotics can safely further process the structure 46 without risk of damage or failure (e.g., can mark the individual semiconductor devices 40 of the structure 46, treat the structure 46, separate the devices 40, etc.).

Figure 9:
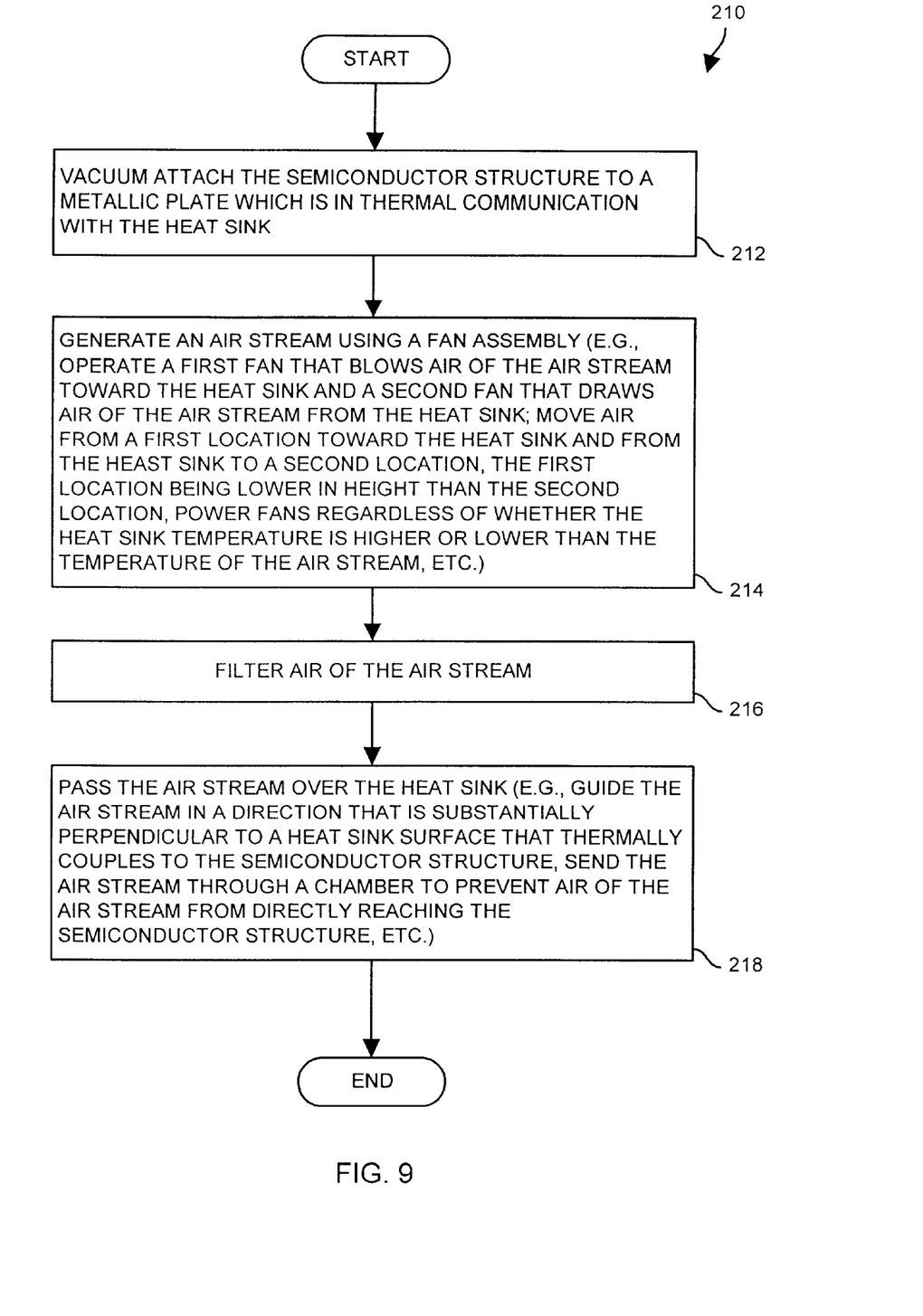
FIG. 9 is a flowchart of a procedure which is suitable for use as one of the steps of the procedure of FIG. 8.

FIG. 9 shows a flowchart of a procedure 210 performed by the test system 20 during the step 206 of the procedure 200 of FIG. 8. In step 212, the vacuum source 152 of the temperature desoak assembly 26 (see FIG. 7) provides a vacuum to vacuum attach the temperature soaked and tested semiconductor structure 44 to a plate 96 (e.g., the plate 96-A) which is in thermal communication with the heat sink 32 (see FIG. 3).

In step 214, the fans 64 of the fluid controller 36 generate an air stream 70 (see FIG. 3). In one arrangement, a first fan 64-A at the input port 60 of the fluid guide moves air from a location 74 toward the heat sink 32 and a second fan 64-B moves air from the heat sink 32 to a second location 82 which is higher than the location 74. In one arrangement, the first fan 64-A blows air toward the heat sink 32, and the second fan 64-B draws air from the heat sink 32. In one arrangement, the fans 64 are always on and constantly generate the air stream 70.

In step 216, the air filter 66 filters air of the air stream 70. Step 216 preferably occurs concurrently with step 214, i.e., as the fans 64 generate the air stream 70.

In step 218, the fluid guide 34 passes the air stream over the heat sink 32. Again, step 218 preferably occurs concurrently with steps 214 and 216, i.e., as the fans 64 generate the air stream 70 and as the air filter 66 filters the air. In one arrangement, the fluid guide 34 directs air of the air stream in a substantially perpendicular direction to the surface 50 defined by the heat sink 32 (also see FIG. 2) for thorough turbulence and mixing, i.e., for effective temperature exchange between the air stream 70 and the heat sink 32. In one arrangement, the shroud 56 and the heat sink 32 form a chamber 78 that is isolated from surface 50 of the heat sink 32 to prevent air of the air stream 70 from directly reaching the semiconductor structures 44 resting on the plates 96-A, 96-B. Accordingly, any moisture or debris in the air stream 70 will not contaminate the semiconductor structures 44.

In one arrangement, the housing of the test system 20 provides a seal so that the air surrounding the semiconductor structures within the test system 20 does not substantially mix with outside factory ambient air which can be relatively warm and humid. Accordingly, during a low temperature test, there is little or no infiltration of the factory ambient air to the inside of the test system 20 that could otherwise result in excessive condensation and/or frosting. Additionally, a user of the test system 20 can periodically flush or purge the inside of the test system 20 with low dew point air or dry nitrogen gas to expel moisture from the regions through which the semiconductor structures pass.

As described above, the invention is directed to techniques for processing a semiconductor structure (e.g., a panel) using a heat sink 32 which defines a surface 50 which is configured to thermally couple with the semiconductor structure. As such, temperature desoaking of the semiconductor structure can simply involve directing a fluid (e.g., factory air) over the heat sink 32 to bring the temperature of the heat sink 32 (and thus the semiconductor structure) toward the temperature of the fluid (e.g., toward room temperature) making the semiconductor structure safe for further handling and processing. Such techniques can desoak the semiconductor structure more quickly than simply waiting for the semiconductor structure to desoak in an inactive manner (i.e., dissipating or absorbing heat while simply sitting idle in a room temperature environment). Additionally, such techniques require less power than the earlier-described conventional handler that requires powering a set of thermo-electric elements. Furthermore, such techniques can be less prone to damage (e.g., simpler and easier to use than thermo-electric elements) and can be less expensive. The features of the invention, as described above, may be employed in automated test equipment components, systems, and procedures, as well as other handling devices, such as those of Teradyne, Inc. of Boston, Mass.

While this invention has been particularly shown and described with references to preferred embodiments thereof, it will be understood by those skilled in the art that various changes in form and details may be made therein without departing from the spirit and scope of the invention as defined by the appended claims.

For example, the test system 20 was described above as being a panel-type handler for thermally conditioning and testing panel-type semiconductor structures (e.g., lead frame structures, BGA assemblies, etc.) by way of example only. Other structures are suitable for thermally conditioning and testing by the test system 20 as well, such as individual semiconductor devices, wafers, Microelectromechanical systems (MEMs) devices, and the like. Also, such structures can have a variety of shapes, sizes and configurations (e.g., an array, a strip, etc.).

Additionally, the fluid used by the test system 20 to temperature desoak the semiconductor structures was described above as ambient air (e.g., factory air) by way of example only. In other arrangements, the fluid is not ambient air (e.g., pressurized and pre-filtered air with low moisture content, nitrogen gas, etc.).

Furthermore, it should be understood that the fans 64-A, 64-B form a fan assembly that generates the air stream 70. This fan assembly can have configurations other than that shown in FIG. 2 or in FIGS. 3–6. For example, in another arrangement, the fan assembly includes two fans 64 at the input port 60 of the fluid guide 34 to provide enough air pressure to effectively temperature desoak the semiconductor structures. In another arrangement, there are no fans at the input port 60 but two or more fans disposed between the heat sink 32 and the supply duct 54 to provide a strong air stream 70 through the heat sink 32. Other configurations for the fan assembly are suitable for use by the test system 20 as well.

Additionally, it should be understood that some of the components of the temperature desoak assembly 26 can form portions of other parts of the test system 20. For example, the vacuum source 152 which provides a vacuum to the heat sink 32 can also be used by the temperature soak assembly 22 and the test assembly 24 to hold the semiconductor structures to plates 96 of those assemblies 22, 24 similar to the plates 96-A, 96-B in order to attach the structures to those plates. As another example, the computer 162 can be used to control other portions of the test system 20 such as the temperature in the test and temperature soak assemblies 24, 22 and the robotics 28, 30 (see FIG. 1) which move the semiconductor structures through the test system 20.

Furthermore, it should be understood that the test system 20 was described above as operating in a pipelined manner. For example, robotics can place semiconductor structures onto temperature soak plates in the temperature soak assembly 22 one at a time but such that the structures temperature soak (i.e., absorb heat or dissipate heat) simultaneously. Then, the robotics can transfer the semiconductor structures from the temperature soak assembly 22 to the test assembly 24 one at a time in the same order that the semiconductor structures entered the temperature soak assembly 22. The robotics can then transfer the semiconductor structures from the test assembly 22 to the temperature desoak assembly 28 one at a time where they temperature desoak simultaneously.

Then, in a similar manner to transfer of semiconductor structure from the temperature soak assembly 22 to the test assembly 24, the robotics can transfer temperature desoaked semiconductor structures form the temperature desoak assembly 26 one a time in the order they entered the temperature desoak assembly 26 for further handling.

Additionally, it should be understood that 155 degrees Celsius was used as a predetermined high temperature for a high temperature test, and –55 degrees Celsius was used as a predetermined low temperature for a low temperature test by way of example only. Other temperatures are suitable for use as well (e.g., a variety of temperatures along a range between –60 and 160 degrees Celsius). Also, 20 degrees (e.g., roughly room temperature) to 50 degrees Celsius was used as a normal handling temperature by way of example only, and other temperature ranges are suitable for use as well.

Furthermore, it should be understood that the temperature desoak assembly 26 can include more than one heat sink 32, or a larger heat sink (with more plates 96), to increase throughput through the temperature desoak assembly 26. In an arrangement having multiple heat sinks 32, certain portions of the temperature desoak assembly 26 can be provided multiple times. For example, in such an arrangement, the fluid controller 36 can include multiple fan assemblies to generate a respective air stream 70 for each heat sink 32, and the fluid guide 34 can include multiple supply ducts 54 to direct each air stream 70 to its respective heat sink 32.

Other portions of the temperature desoak assembly 26 can be shared. For example, in one arrangement, the fluid controller 36 can include a single computer to control the operation of the optional heaters 104 in a multiplexing or multitasking manner. As another example, each of the heat sinks 32 can connect to the same vacuum source 152.

Additionally, it should be understood that the plates 96 were shown as rectangular-shaped by way of example only. Other shapes are suitable as well are can be largely dictated by the shape of the structures to be desoaked. In other arrangements, the plates 96 are circular, square-shaped, hexagonal, or other shapes. In some arrangements, the differently-shaped plates 96 are interchangeable thus enabling the test system 20 to be easily reconfigured to accommodate structures having a variety of shapes and sized.

Furthermore, it should be understood that the plates 96 were described above as fastening to the surface 50 of the heat sink 32 using a vacuum by way of example only. The vacuum enables the plates 96 to be easily changed for convenience. Nevertheless other fastening mechanisms are suitable for use as well such as screws, flanges, clips, clamps, etc.

Additionally, it should be understood that the air stream 70 was described as encountering the heat sink 32 at a substantially perpendicular angle by way of example only. In other arrangements, the air stream 70 passes through the heat sink 32 in the direction along the length of the duct (e.g., in a direction that is substantially parallel to the surface 50 defined by the heat sink 32).

Furthermore, it should be understood that the air stream 70 was described as flowing through the heat sink 32 with high turbulence (e.g., with many vortexes) by way of example only. In other arrangements, there is substantially laminar flow through the heat sink 32. Such modifications and enhancements are intended to be part of embodiments of the invention, and the invention should be limited only by the spirit and scope of the claims.

What is claimed is:

1. A semiconductor handling system, comprising:
   (a) a temperature soak assembly to temperature soak a semiconductor structure;
   (b) a test assembly, coupled to the temperature soak assembly, to test the semiconductor structure; and
   (c) a temperature desoak assembly, coupled to the test assembly, to temperature desoak the semiconductor structure, the temperature desoak assembly including:
      (i) a heat sink that defines a surface which is configured to thermally couple with the semiconductor structure,
      (ii) a fluid guide coupled to the heat sink, and
      (iii) a fluid controller, coupled to the fluid guide, that provides a fluid which the fluid guide directs over the heat sink to bring a temperature of the heat sink to a temperature of the fluid.

2. The semiconductor handling system of claim 1 wherein the fluid controller includes:
   a fan assembly that generates an air stream, as the fluid, which the fluid guide directs over the heat sink.

3. The semiconductor handling system of claim 2 wherein the surface defined by the heat sink is substantially planar, and wherein the fluid guide is configured to guide the air stream over the heat sink in a direction that is substantially perpendicular to the surface defined by the heat sink.

4. The semiconductor handling system of claim 2 wherein the fluid guide includes:
   a shroud coupled to the heat sink, the shroud of the fluid guide and the heat sink defining a chamber to substantially prevent air of the air stream from directly reaching the semiconductor structure.

5. The semiconductor handling system of claim 2 wherein the fluid guide defines:
   an air stream input port at a first location; and
   an air stream output port at a second location, the first location having a height that is lower than that of the second location.

6. The semiconductor handling system of claim 5 wherein the fan assembly of the fluid controller includes:
   a first fan, coupled to the input port defined by the fluid guide, that blows air of the air stream toward the heat sink; and
   a second fan, coupled to the output port defined by the fluid guide, that draws air of the air stream away from the heat sink.

7. The semiconductor handling system of claim 6 wherein the first and second fans of the fan assembly are configured to provide the air stream regardless of whether the temperature of the heat sink is higher or lower than a temperature of the air stream.

8. The semiconductor handling system of claim 5 wherein the fluid controller further includes:
   an air filter, proximate to the input port defined by the fluid guide, to filter air of the air stream.

9. The semiconductor handling system of claim 1, further comprising:
   a set of heating elements, embedded within the heat sink, to raise the temperature of the heat sink.

10. The semiconductor handling system of claim 1 wherein the heat sink includes:
    a plane-shaped member upon which the semiconductor structure resides when the semiconductor structure thermally couples with the heat sink; and
    a set of substantially parallel fins to exchange heat with the fluid, each fin extending substantially perpendicularly from the plane-shaped member.

11. The semiconductor handling system of claim 1 wherein the fluid guide and the fluid controller are configured to channel, as the fluid, factory ambient air from a location external to the semiconductor handling system through the heat sink to adjust a temperature of the semiconductor structure when the semiconductor structure resides on the plane-shaped member of the heat sink.

12. The semiconductor handling system of claim 11 wherein the heat sink includes:
    a plane-shaped member upon which the semiconductor structure resides when the semiconductor structure thermally couples with the heat sink; and
    a set of substantially parallel fins to exchange heat with the factory ambient air, each fin extending substantially perpendicularly from the plane-shaped member.

13. A semiconductor handling system, comprising:
    (a) a temperature soak assembly to temperature soak a semiconductor structure;
    (b) a test assembly, coupled to the temperature soak assembly, to test the semiconductor structure; and
    (c) a temperature desoak assembly, coupled to the test assembly, to temperature desoak the semiconductor structure, the temperature desoak assembly including:
       (i) a heat sink that defines a surface which is configured to thermally couple with the semiconductor structure,
       (ii) a fluid guide coupled to the heat sink, and
       (iii) a fluid controller, coupled to the fluid guide, that directs factory ambient air from a location external to the semiconductor handling system through the heat sink to bring a temperature of the heat sink to a temperature of the factory ambient air.

14. A semiconductor handling system, comprising:
    (a) a temperature soak assembly to temperature soak a semiconductor structure;
    (b) a test assembly, coupled to the temperature soak assembly, to test the semiconductor structure; and
    (c) a temperature desoak assembly, coupled to the test assembly, to temperature desoak the semiconductor structure, the temperature desoak assembly including:
       (i) a heat sink that defines a surface which is configured to thermally couple with the semiconductor structure, and
       (ii) means for forcing factory ambient air from a location external to the semiconductor handling system through the heat sink to bring a temperature of the heat sink to a temperature of the factory ambient air.

* * * * *